United States Patent
Kikuchi

(10) Patent No.: US 8,106,696 B2
(45) Date of Patent: Jan. 31, 2012

(54) DUTY RATIO CORRECTION CIRCUIT AND DUTY RATIO CORRECTION METHOD

(75) Inventor: Kazutaka Kikuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/697,743

(22) Filed: Feb. 1, 2010

(65) Prior Publication Data

US 2010/0219870 A1 Sep. 2, 2010

(30) Foreign Application Priority Data

Mar. 2, 2009 (JP) .................................. 2009-047692

(51) Int. Cl.
*H03K 3/017* (2006.01)

(52) U.S. Cl. ........................................................ 327/175

(58) Field of Classification Search .................... 327/175
See application file for complete search history.

(56) References Cited

U.S. PATENT DOCUMENTS

| 6,181,178 | B1 * | 1/2001 | Choi ............................... 327/175 |
| 6,853,225 | B2 * | 2/2005 | Lee ................................ 327/158 |
| 7,230,464 | B2 * | 6/2007 | Rashid ........................... 327/175 |
| 7,250,801 | B2 * | 7/2007 | Minzoni ........................ 327/175 |
| 7,307,461 | B2 * | 12/2007 | Nguyen et al. ................ 327/172 |
| 7,463,075 | B2 * | 12/2008 | White ............................ 327/175 |
| 2007/0152680 | A1 | 7/2007 | Fujisawa et al. |

FOREIGN PATENT DOCUMENTS

| JP | 2002-190196 A | 7/2002 |
| JP | 2006-12363 A | 1/2006 |
| JP | 2006-13990 A | 1/2006 |
| JP | 2007-121114 A | 5/2007 |

* cited by examiner

*Primary Examiner* — Hai L Nguyen
(74) *Attorney, Agent, or Firm* — Foley & Lardner LLP

(57) ABSTRACT

A duty ratio correction circuit includes a clock input buffer that receives a first clock signal, a clock duty adjuster that adjusts a duty ratio of a second clock signal output from the clock input buffer based on a correction signal and generates a third clock signal, a data input buffer that receives a first data signal, a data duty adjuster that adjusts a duty ratio of a second data signal output from the data input buffer based on the correction signal and generates a third data signal, and a duty comparator that generates the correction signal based on the third clock signal.

13 Claims, 10 Drawing Sheets

DUTY RATIO CORRECTION CIRCUIT AND DUTY RATIO CORRECTION METHOD

INCORPORATION BY REFERENCE

This application is based upon and claims the benefit of priority from Japanese patent application No. 2009-047692, filed on Mar. 2, 2009, the disclosure of which is incorporated herein in its entirety by reference.

BACKGROUND

1. Field of the Invention

The present invention relates to a duty ratio correction circuit and a duty ratio correction method.

2. Description of Related Art

A memory interface is becoming increasingly faster with the recent trend towards higher-speed and lower-voltage operation of an application-specific integrated circuit (ASIC), a microprocessor or the like. Particularly, in double-data-rate (DDR) mode, the deviation of the duty ratio of a clock which is fed into a circuit is a contributing factor to degradation of the setup/hold characteristics. Japanese Unexamined Patent Application Publications Nos. 2002-190196 and 2007-121114 disclose a method of correcting a clock duty ratio.

Further, the deviation of the duty ratio of an asynchronous signal such as data or address due to the characteristics of an input circuit or another circuit is also a contributing factor to degradation of the setup/hold characteristics, just like the case of a clock. Japanese Unexamined Patent Application Publications Nos. 2006-012363 and 2006-013990 disclose a technique of correcting the amount of data delay.

FIG. 8 is a view to describe a concern of the present invention, which shows an example of a clock duty ratio correction circuit. The duty ratio correction circuit includes an input buffer 1 for data, an input buffer 2 for clock, a duty adjuster 4, a duty comparator 5, and a latch circuit 6.

The data input buffer 1 converts an external data signal IN_EX into an internal data signal IN. The internal data signal IN is then input to the latch circuit 6.

The clock input buffer 2 shapes the waveform of an external clock signal CLK which is input from the outside of a semiconductor storage device and converts it into a signal level to be used inside the semiconductor storage device. The clock input buffer 2 then outputs a clock signal P_CLK.

The duty adjuster 4 corrects the duty ratio of the clock signal P_CLK which is output from the input buffer 2 based on a potential signal DUTY_DC which is fed back from the duty comparator 5. The duty adjuster 4 then outputs an internal clock signal IN_CLK to the latch circuit 6 and the duty comparator 5.

The duty comparator 5 monitors the duty ratio of the internal clock signal IN_CLK and integrates the deviation of the duty ratio in each cycle. The duty comparator 5 then outputs the potential signal DUTY_DC. In such a configuration, the duty ratio of the internal clock signal IN_CLK can be corrected.

FIG. 9A shows an ideal waveform of the external data signal IN_EX with respect to the external clock signal CLK. The external data signal IN_EX is input such that it is VALID during the period of the setup time (TS) and the hold time (TH) which are described in the data sheet or the like with respect to the external clock signal CLK.

Specifically, the external data signal IN_EX(H) changes like "L, H, L" in order that it is H during the period of the setup time TS and the hold time TH. On the other hand, the external data signal IN_EX(L) changes like "H, L, H" in order that it is L during the period of the setup time TS and the hold time TH.

The internal clock signal IN_CLK and the internal data signals IN(H) and IN(L) in FIG. 9B show signals at the point where the external clock signal CLK and the external data signals IN_EX(H) and IN_EX(L) in FIG. 9A have passed through the input buffer 1 or 2 or the like and reached the latch circuit 6.

The deviation between the time when the internal data signal IN(H) changes from H to L and the internal data signal IN(L) changes from L to H is referred to as a duty deviation time TD. As shown in FIG. 9B, by passing through the input buffer 1 or the like, the hold time TH with respect to the internal clock signal IN_CLK is degraded by the length of the duty deviation time TD of data. Therefore, it is necessary to correct the duty ratio of data or address also as described above.

However, there is a concern that the duty adjuster 4 and the duty comparator 5 for clock cannot be used for an asynchronous signal such as data or address. The reason is described hereinbelow.

Provided that an asynchronous signal such as data or address satisfies the setup time and the hold time which are described in the data sheet or the like with respect to the external clock signal CLK, the asynchronous signal may have a signal level of either H or L in the other times.

Therefore, in the case where the internal data signal IN changes like "L, L, H" with respect to the external clock signal CLK as shown in FIG. 10, for example, the duty ratio of a signal with a cycle of T_IN is adjusted even if there is no deviation of the duty ratio due to the input buffer 1 for data. In such a case, the duty ratio is wrongly determined to be 1/3=33%, which is low.

SUMMARY

A first exemplary aspect of an embodiment of the present invention is a duty ratio correction circuit that includes a clock input buffer that receives a first clock signal, a clock duty adjuster that adjusts a duty ratio of a second clock signal output from the clock input buffer based on a correction signal and generates a third clock signal, a data input buffer that receives a first data signal, a data duty adjuster that adjusts a duty ratio of a second data signal output from the data input buffer based on the correction signal and generates a third data signal, and a duty comparator that generates the correction signal based on the third clock signal.

A second exemplary aspect of an embodiment of the present invention is a duty ratio correction method that includes generating a second clock signal from an input first clock signal through a clock input buffer, generating a second data signal from an input first data signal through a data input buffer, generating a third clock signal by adjusting a duty ratio of the second clock signal based on a correction signal, generating a third data signal by adjusting a duty ratio of the second data signal based on the correction signal, and generating the correction signal based on the third clock signal.

It is possible to adjust the duty ratio of the second data signal by using the correction signal which is generated based on the third clock signal.

According to the embodiments described above, it is possible to provide a duty ratio correction circuit capable of correcting the duty ratio of an asynchronous signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described hereinbelow with respect to the drawings. The explanation provided hereinbelow merely illustrates the exemplary embodiments of the present invention, and the present invention is not limited to the below-described exemplary embodiments. The following description and the attached drawings are appropriately shortened and simplified to clarify the explanation. It should be noted that a data signal as referred to in this specification includes an address signal.

First Exemplary Embodiment

Figure 1:
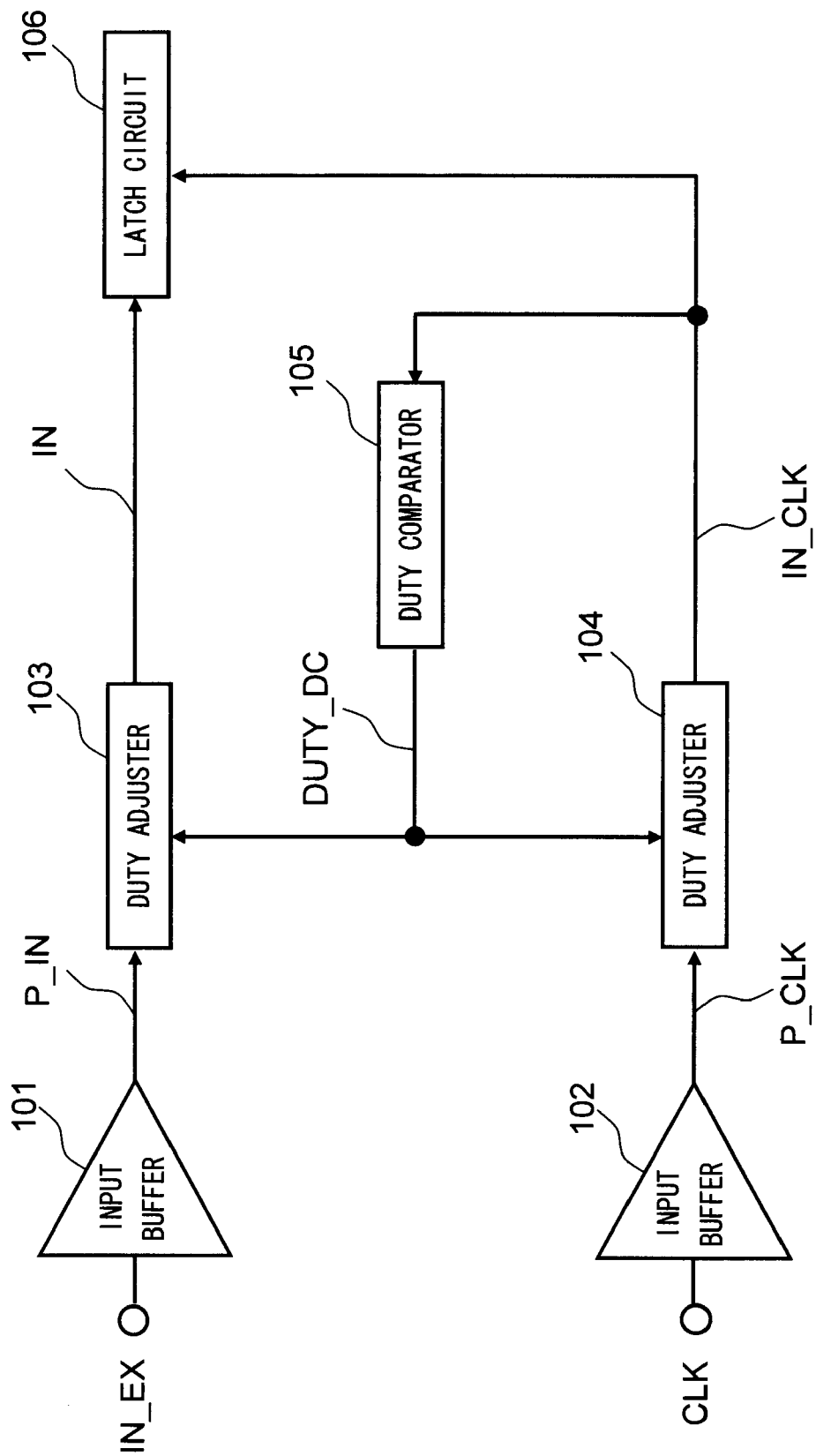
FIG. 1 is a block diagram of a duty ratio correction circuit according to a first exemplary embodiment of the present invention.

FIG. 1 is a block diagram of a duty ratio correction circuit according to a first exemplary embodiment of the present invention. The duty ratio correction circuit is used for a semiconductor storage device, for example. The duty ratio correction circuit includes an input buffer 101 for data, an input buffer 102 for clock, a duty adjuster 103 for data, a duty adjuster 104 for clock, a duty comparator 105 and a latch circuit 106.

An external data signal IN_EX such as data or address is input to the input buffer 101 from the outside of the semiconductor storage device. The input buffer 101 shapes the waveform of the input external data signal IN_EX and converts it into a signal level to be used inside the semiconductor storage device.

An external clock signal CLK is input to the input buffer 102 from the outside of the semiconductor storage device. The input buffer 102 shapes the waveform of the input external clock signal CLK and converts it into a signal level to be used inside the semiconductor storage device.

The input buffers 101 and 102 preferably have the same circuit configuration.

The duty adjuster 103 is connected to the input buffer 101 and receives a data signal P_IN which is output from the input buffer 101. The duty adjuster 103 is also connected to the duty comparator 105 and receives a potential signal DUTY_DC which is output from the duty comparator 105. The duty adjuster 103 corrects the duty ratio of the data signal P_IN which is output from the input buffer 101 based on the potential signal DUTY_DC. The duty adjuster 103 then outputs an internal data signal IN to the latch circuit 106.

The duty adjuster 104 is connected to the input buffer 102 and receives a clock signal P_CLK which is output from the input buffer 102. The duty adjuster 104 is also connected to the duty comparator 105 and receives the potential signal DUTY_DC which is output from the duty comparator 105. The duty adjuster 104 corrects the duty ratio of the clock signal P_CLK which is output from the input buffer 102 based on the potential signal DUTY_DC. The duty adjuster 104 then outputs an internal clock signal IN_CLK to the latch circuit 106 and the duty comparator 105.

The duty adjusters 103 and 104 preferably have the same circuit configuration.

The duty comparator 105 is connected to the duty adjuster 104 and receives the internal clock signal IN_CLK which is output from the duty adjuster 104. The duty comparator 105 monitors the duty ratio of the internal clock signal IN_CLK and integrates the deviation of the duty ratio in each cycle. The duty comparator 105 then outputs the potential signal DUTY_DC to the duty adjusters 103 and 104.

The latch circuit 106 is connected to the duty adjusters 103 and 104 and receives the internal data signal IN and the internal clock signal IN_CLK whose duty ratio have been corrected by the respective adjusters, as described above.

Figure 2:
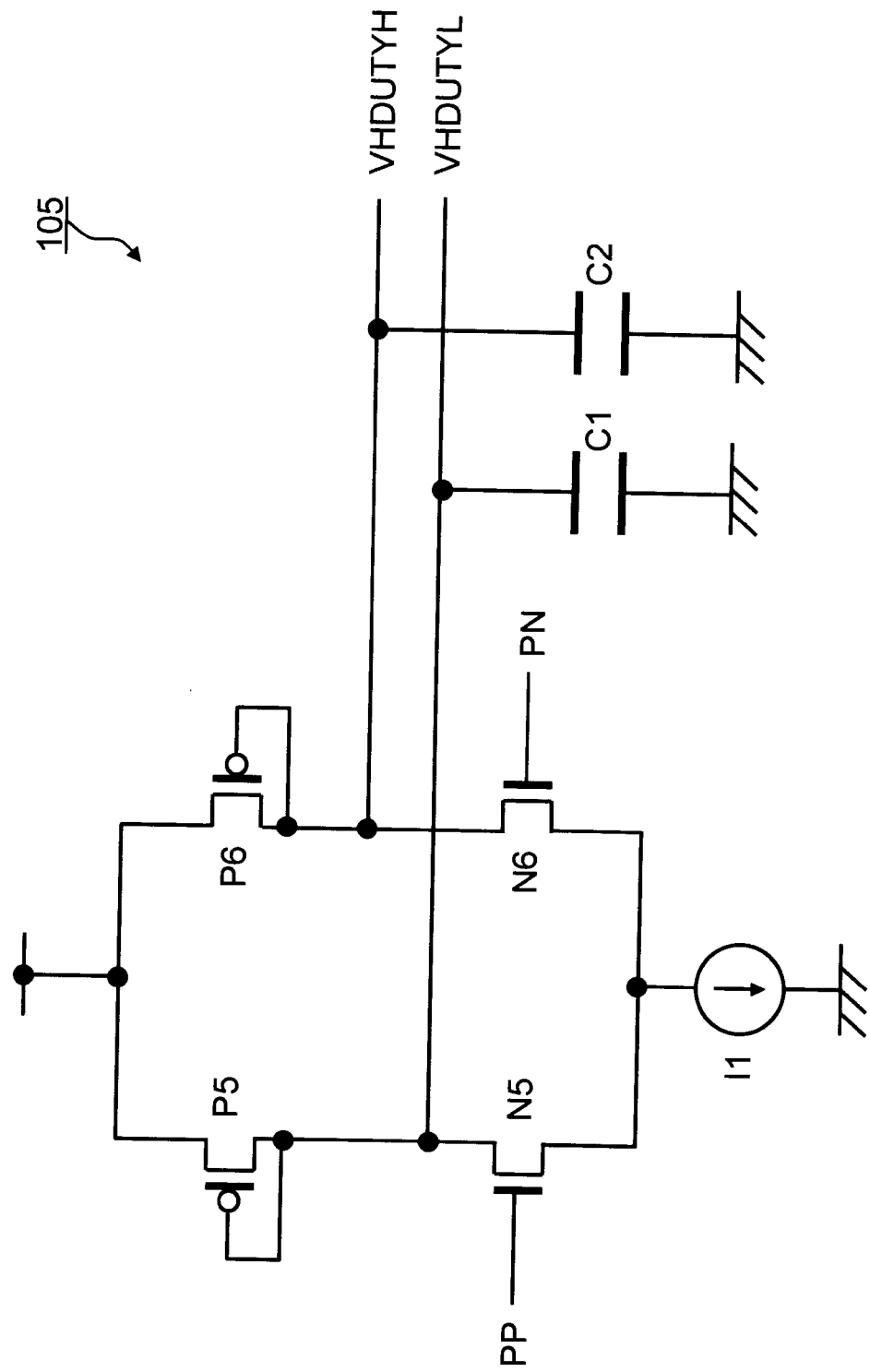
FIG. 2 is an example of a duty comparator according to the first exemplary embodiment of the present invention.

FIG. 2 shows an example of the duty comparator 105. A clock signal PP is a signal which is in phase with the internal clock signal IN_CLK and to which a certain length of delay is added. On the other hand, a clock signal PN is a signal which is in opposite phase to the internal clock signal IN_CLK and to which the same length of delay as that of the clock signal PP is added.

The clock signals PP and PN are input to a differential amplifier which is composed of P-channel MOS transistors P5 and P6 and N-channel MOS transistors N5 and N6. Specifically, the clock signals PP and PN are input to the gates of the N-channel MOS transistors N5 and N6, respectively.

The sources of the P-channel MOS transistors P5 and P6 which constitute the differential amplifier are both connected to a power supply VDD. The drains of the P-channel MOS transistors P5 and P6 are respectively connected to the drains of the N-channel MOS transistors N5 and N6. The gates of the P-channel MOS transistors P5 and P6 are respectively connected to their own drains.

The sources of the N-channel MOS transistors N5 and N6 which constitute the differential amplifier are both connected to one end of a current source I1. The other end of the current source I1 is grounded. The drains of the N-channel MOS transistors N5 and N6 are respectively connected to the drains of the P-channel MOS transistors P5 and P6.

Further, a differential amplifier output signal VHDUTYL is output from a node at which the drains of the P-channel MOS transistor P5 and the N-channel MOS transistor N5 are connected to each other. The node is also connected to one end of a capacitor C1. The other end of the capacitor C1 is grounded.

Furthermore, a differential amplifier output signal VHDUTYH is output from a node at which the drains of the P-channel MOS transistor P6 and the N-channel MOS transistor N6 are connected to each other. The node is also connected to one end of a capacitor C2. The other end of the capacitor C2 is grounded.

In the case where the duty ratio of the internal clock signal IN_CLK is low, the period when the N-channel MOS transistor N5 is ON becomes shorter and the period when the N-channel MOS transistor N6 is ON becomes longer in one cycle. As a result, VHDUTYL becomes higher, and VHDUTYH becomes lower. Accordingly, a potential difference occurs between VHDUTYL and VHDUTYH.

On the contrary, when the duty ratio of the internal clock signal IN_CLK is high, VHDUTYL becomes lower, and VHDUTYH becomes higher.

Figure 3:
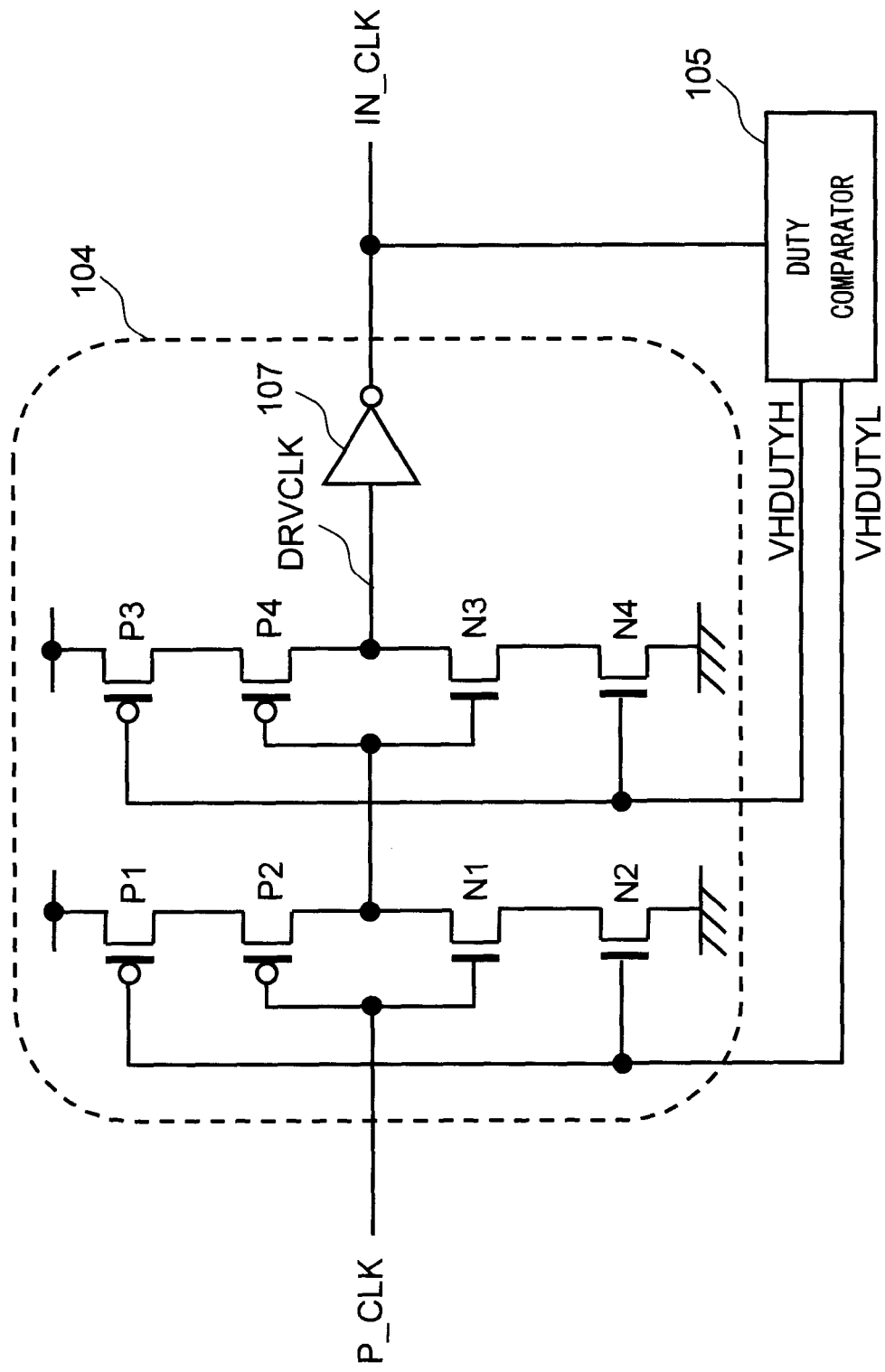
FIG. 3 is an example of a duty adjuster according to the first exemplary embodiment of the present invention.

FIG. 3 shows an example of the duty adjuster 104.

The duty adjuster 104 includes two clocked inverters and an inverter 107 which are connected in series. The clock signal P_CLK is input to the clocked inverter in the first stage, and the internal clock signal IN_CLK is output from the inverter 107.

The clocked inverter in the first stage is composed of P-channel MOS transistors P1 and P2 and N-channel MOS transistors N1 and N2. The source of the P-channel MOS transistor P1 is connected to a power supply VDD, and the drain of the P-channel MOS transistor P1 is connected to the source of the P-channel MOS transistor P2. The drain of the P-channel MOS transistor P2 is connected to the drain of the N-channel MOS transistor N1. The source of the N-channel MOS transistor N1 is connected to the drain of the N-channel MOS transistor N2. The source of the N-channel MOS transistor N2 is grounded.

The clock signal P_CLK is input to the gate of the P-channel MOS transistor P2 and the gate of the N-channel MOS transistor N1. On the other hand, the signal VHDUTYL which is output from the duty comparator 105 is input to the gate of the P-channel MOS transistor P1 and the gate of the N-channel MOS transistor N2. Then, an output signal of the clocked inverter in the first stage is output from a node at which the drain of the P-channel MOS transistor P2 and the drain of the N-channel MOS transistor N1 are connected to each other.

The clocked inverter in the second stage is composed of P-channel MOS transistors P3 and P4 and N-channel MOS transistors N3 and N4. The source of the P-channel MOS transistor P3 is connected to a power supply VDD, and the drain of the P-channel MOS transistor P3 is connected to the source of the P-channel MOS transistor P4. The drain of the P-channel MOS transistor P4 is connected to the drain of the N-channel MOS transistor N3. The source of the N-channel MOS transistor N3 is connected to the drain of the N-channel MOS transistor N4. The source of the N-channel MOS transistor N4 is grounded.

The output signal from the clocked inverter in the first stage is input to the gate of the P-channel MOS transistor P4 and the gate of the N-channel MOS transistor N3. On the other hand, the signal VHDUTYH which is output from the duty comparator 105 is input to the gate of the P-channel MOS transistor P3 and the gate of the N-channel MOS transistor N4. Then, an output signal DRVCLK of the clocked inverter in the second stage is output from a node at which the drain of the P-channel MOS transistor P4 and the drain of the N-channel MOS transistor N3 are connected to each other.

The output signal DRVCLK of the clocked inverter in the second stage is input to the inverter 107. The inverter 107 then inverts and shapes the output signal DRVCLK of the clocked inverter in the second stage and outputs it as the internal clock signal IN_CLK.

The operation of the circuit is described hereinafter.

In the case where the duty ratio of the clock signal P_CLK is higher than 50%, for example, VHDUTYH is higher than VHDUTYL. Therefore, a gate-source voltage (Vgs) of the P-channel MOS transistor P1 increases, and a gate-source voltage (Vgs) of the N-channel MOS transistor N2 decreases. Accordingly, the duty ratio of the output of the clocked inverter in the first stage is higher than that of the internal clock signal IN_CLK.

In this case, in the clocked inverter in the second stage, because VHDUTYH is high, a gate-source voltage (Vgs) of the P-channel MOS transistor P3 decreases, and a gate-source voltage (Vgs) of the N-channel MOS transistor N4 increases. Accordingly, when VHDUTYH is higher than VHDUTYL, the duty ratio of the output signal DRVCLK of the clocked inverter in the second stage becomes lower.

On the contrary, in the case where the duty ratio of the clock signal P_CLK is lower than 50%, the duty ratio of the output signal DRVCLK of the clocked inverter in the second stage becomes higher.

The main cause of the deviation of the duty ratio against a normal input signal with a duty ratio of 50% is a difference between the transfer time of "H" (the time period from when the external clock signal CLK becomes "H" to when the clock signal P_CLK becomes "H") and the transfer time of "L" (the time period from when the external clock signal CLK becomes "L" to when the clock signal P_CLK becomes "L") of the input buffer. The deviation of the duty ratio is corrected by making the transfer time coincide with each other.

On the other hand, a difference between the transfer time of "H" (the time period from when IN_EX becomes "H" to when P_IN becomes "H") and the transfer time of "L" (the time period from when IN_EX becomes "L" to when P_IN becomes "L") occurs also in asynchronous external data (address). This is the deviation of the duty ratio of data (address).

As described in the exemplary embodiment, the deviation of the duty ratio of the clock signal P_CLK which is a synchronous signal and the deviation of the duty ratio of the data signal P_IN which is an asynchronous signal become equal with use of the input buffers of the same circuit configuration. Therefore, by inputting a duty ratio correction value (which is the potential signal DUTY_DC in this exemplary embodiment) of the clock signal P_CLK to the duty adjuster of the data signal P_IN, it is possible to correct the duty ratio of the data signal P_IN.

Second Exemplary Embodiment

A second exemplary embodiment of the present invention is descried hereinafter with reference to FIG. 4.

The circuit configuration of duty adjusters 203 and 204 according to this exemplary embodiment is different from the circuit configuration of the duty adjusters 103 and 104 according to the first exemplary embodiment. Further, a duty comparator 205 according to this exemplary embodiment is different from the duty comparator 105 according to the first exemplary embodiment. Furthermore, in this exemplary embodiment, a control circuit 208 is added in the subsequent stage of the duty comparator 205.

In this configuration, a control logic signal DUTY_SEL is output from the control circuit 208, instead of the potential signal DUTY_DC which is output from the duty comparator 105 according to the first exemplary embodiment, and input to the duty adjusters 203 and 204. With the control logic signal DUTY_SEL, the circuit can be expected to operate more stably against noise compared to the potential signal DUTY_DC. The other configuration is the same as shown in FIG. 1 and thus not redundantly described.

Figure 5:
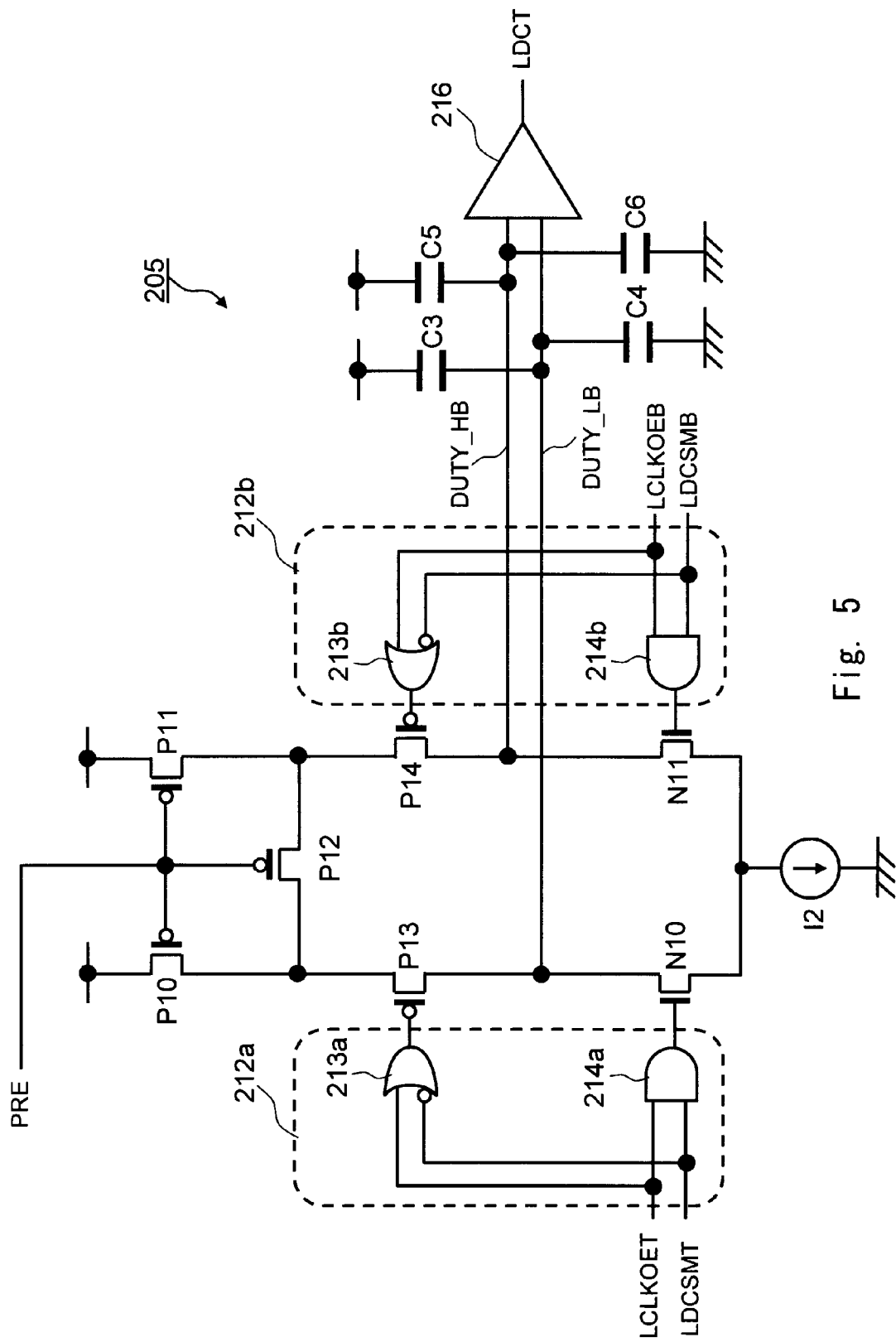
FIG. 5 is an example of a duty comparator according to the second exemplary embodiment of the present invention.

FIG. 5 is an example of the duty comparator 205 according to the exemplary embodiment. The duty comparator 205 includes a current source I2, comparison target clock input MOS transistors N10 and N11, load MOS transistors P13 and P14, precharge MOS transistors P10, P11 and P12, input control circuits 212a and 212b, capacitors C3 to C6, and a comparator 216 that compares outputs.

The precharge MOS transistors P10, P11 and P12 are P-channel transistors. A precharge signal PRE is input to the gates of the precharge MOS transistors P10, P11 and P12. The sources of the precharge MOS transistors P10 and P11 are connected to a power supply VDD. The drains of the precharge MOS transistors P10 and P11 are respectively connected to the source or the drain of the precharge MOS transistor P12.

The load MOS transistors P13 and P14 are P-channel transistors. The sources of the load MOS transistors P13 and P14 are respectively connected to the drains of the precharge MOS transistors P10 and P11. The comparison target clock input MOS transistors N10 and N11 are N-channel transistors. The sources of the comparison target clock input MOS transistors N10 and N11 are both connected to one end of the current source I2. The other end of the current source I2 is grounded. The drains of the comparison target clock input MOS transistors N10 and N11 are respectively connected to the drains of the load MOS transistors P13 and P14.

Outputs signals of OR gates 213a and 213b are respectively input to the gates of the load MOS transistors P13 and P14. A clock signal LCLKOET which is in phase with the internal clock signal IN_CLK and an inverted signal of a detection start signal LDCSMT are input to the OR gate 213a. An inverted clock signal LCLKOEB which is in opposite phase to the internal clock signal IN_CLK and an inverted signal of a detection start signal LDCSMB are input to the OR gate 213b.

Output signals of AND gates 214a and 214b are respectively input to the gates of the comparison target clock input MOS transistors N10 and N11. The clock signal LCLKOET and the detection start signal LDCSMT are input to the AND gate 214a. The inverted clock signal LCLKOEB and the detection start signal LDCSMB are input to the AND gate 214b.

Then, an output signal DUTY_LB is output from a node at which the drain of the comparison target clock input MOS transistor N10 and the drain of the load MOS transistor P13 are connected to each other. Further, an output signal DUTY_HB is output from a node at which the drain of the comparison target clock input MOS transistor N11 and the drain of the load MOS transistor P14 are connected to each other.

The output signal DUTY_LB and the output signal DUTY_HB are connected to the comparator 216. Further, the output signal DUTY_LB is connected to one ends of the capacitors C3 and C4. The other end of the capacitor C3 is connected to the power supply VDD, and the other end of the capacitor C4 is grounded. Likewise, the output signal DUTY_HB is connected to one ends of the capacitors C5 and C6. The other end of the capacitor C5 is connected to the power supply VDD, and the other end of the capacitor C6 is grounded.

Figure 6:
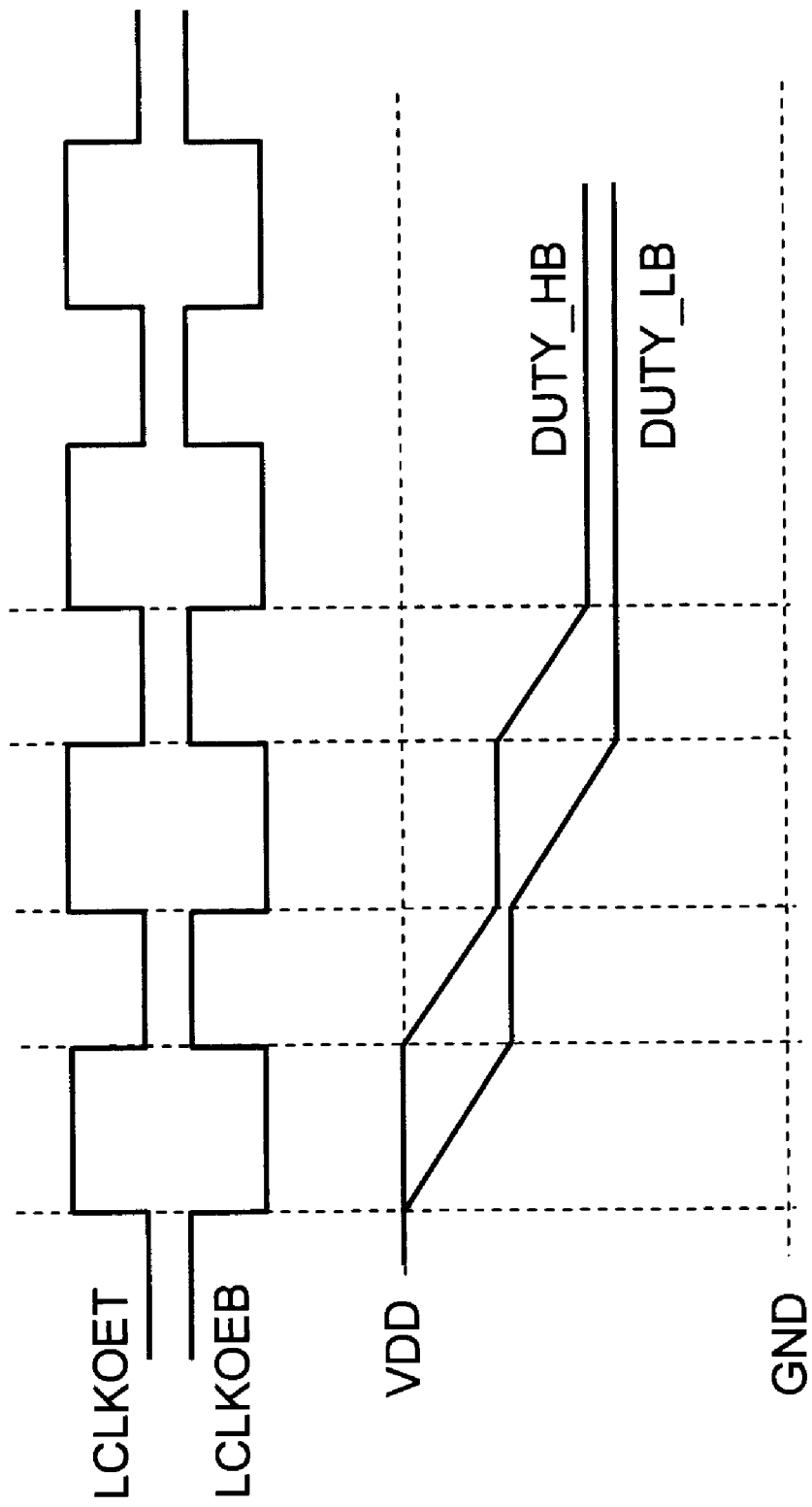
FIG. 6 is an internal waveform of a duty comparator according to the second exemplary embodiment of the present invention.

The operation of the circuit is described hereinafter with reference to the timing chart of FIG. 6.

First, as preparation of duty detection, the precharge signal PRE is input to the gates of the precharge MOS transistors P10, P11 and P12.

By the precharge, the signal levels of the output signals DUTY_HB and DUTY_LB are raised to the power supply potential VDD.

Next, detection is started by activation of the detection start signal LDCSMT/B. During the period when the clock signal LCLKOET is the high level "H", the N-channel MOS transistor N10 is in the ON state. Therefore, accumulated charges are partly discharged, and the potential of the output signal DUTY_LB becomes lower. During the period when the inverted clock signal LCLKOEB is the high level "H", the N-channel MOS transistor N11 is in the ON state. Therefore, accumulated charges are partly discharged, and the potential of the output signal DUTY_HB becomes lower.

During the period when the clock signal LCLKOET/B is the low level "L", the N-channel MOS transistors N10 and N11 are in the OFF state, and the potentials of the output signals DUTY_HB and DUTY_LB are maintained. Thus, the potentials of the output signals DUTY_HB and DUTY_LB become lower in proportion to the length of the high level period of the clock. For example, the clock is input two cycles, and the comparator 216 compares the potentials of the output signals DUTY_HB and DUTY_LB at that time, determines a difference between the potentials and outputs a determination signal LDCT.

When a clock duty ratio is the same, the potentials of the output signals DUTY_HB and DUTY_LB are equal. On the other hand, assume the case where a duty ratio is 40% (the period of the high level "H" is 40% in the cycle period) and there is the deviation of a duty ratio, for example. In such a case, the ON period of the N-channel MOS transistor N11 to which the inverted clock signal LCLKOEB is input is longer than the ON period of the N-channel MOS transistor N10 to which the clock signal LCLKOET is input. Accordingly, the potential of the output signal DUTY_HB is lower than the potential of the output signal DUTY_LB.

On the contrary, with a duty ratio of 60%, the ON period of the N-channel MOS transistor N10 to which the clock signal LCLKOET is input is longer than the ON period of the N-channel MOS transistor N11 to which the inverted clock signal LCLKOEB is input. Accordingly, the potential of the output signal DUTY_LB is lower than the potential of the output signal DUTY_HB as shown in FIG. 6. In this manner, a potential difference is generated by discharging the potential which is charged to the power supply potential VDD in the period in proportion to the duty ratio. The potential difference is then compared by the comparator, thereby detecting the deviation of the duty ratio.

Figure 7:
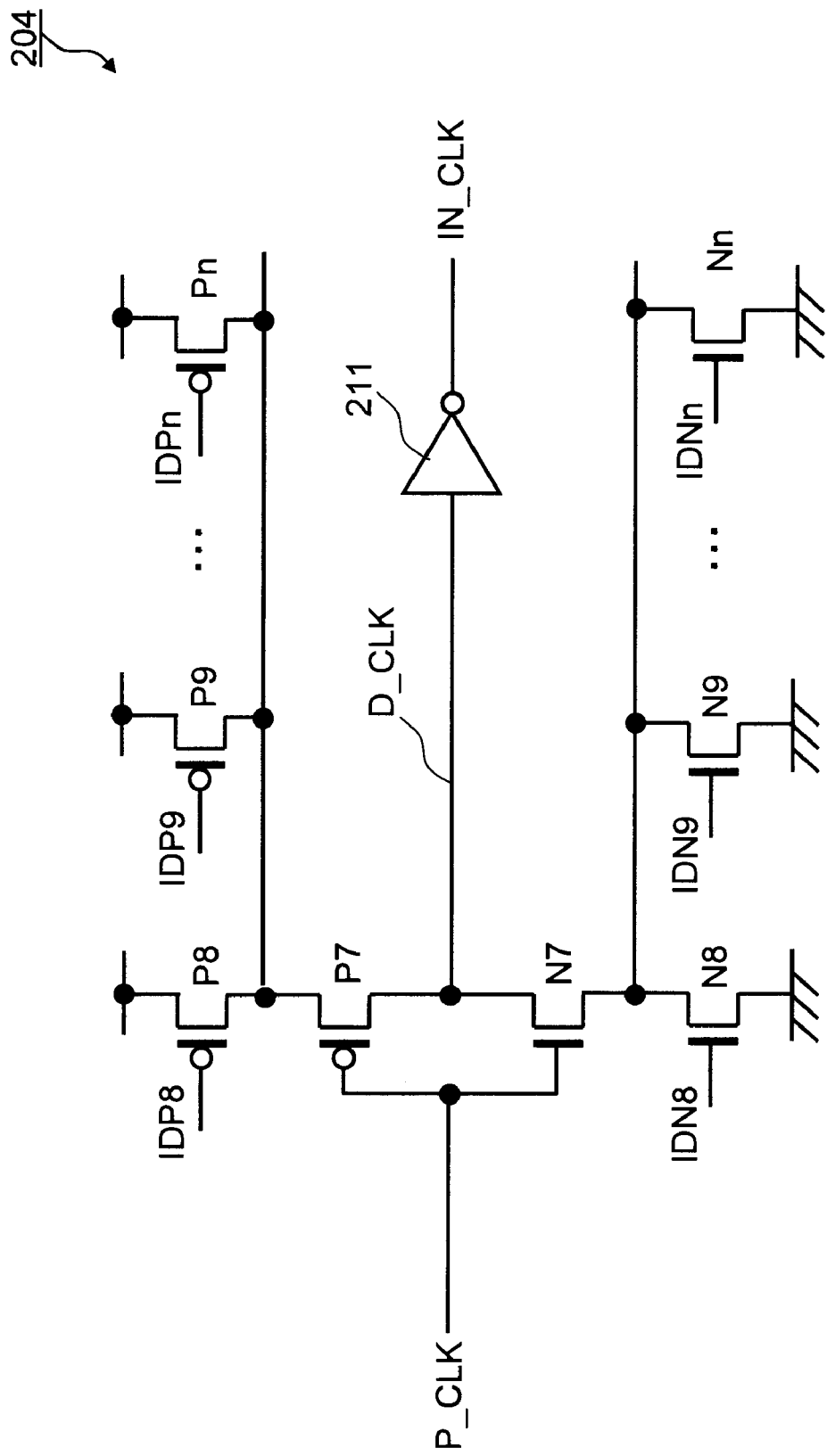
FIG. 7 is an example of a duty adjuster according to the second exemplary embodiment of the present invention.
Figure 8:
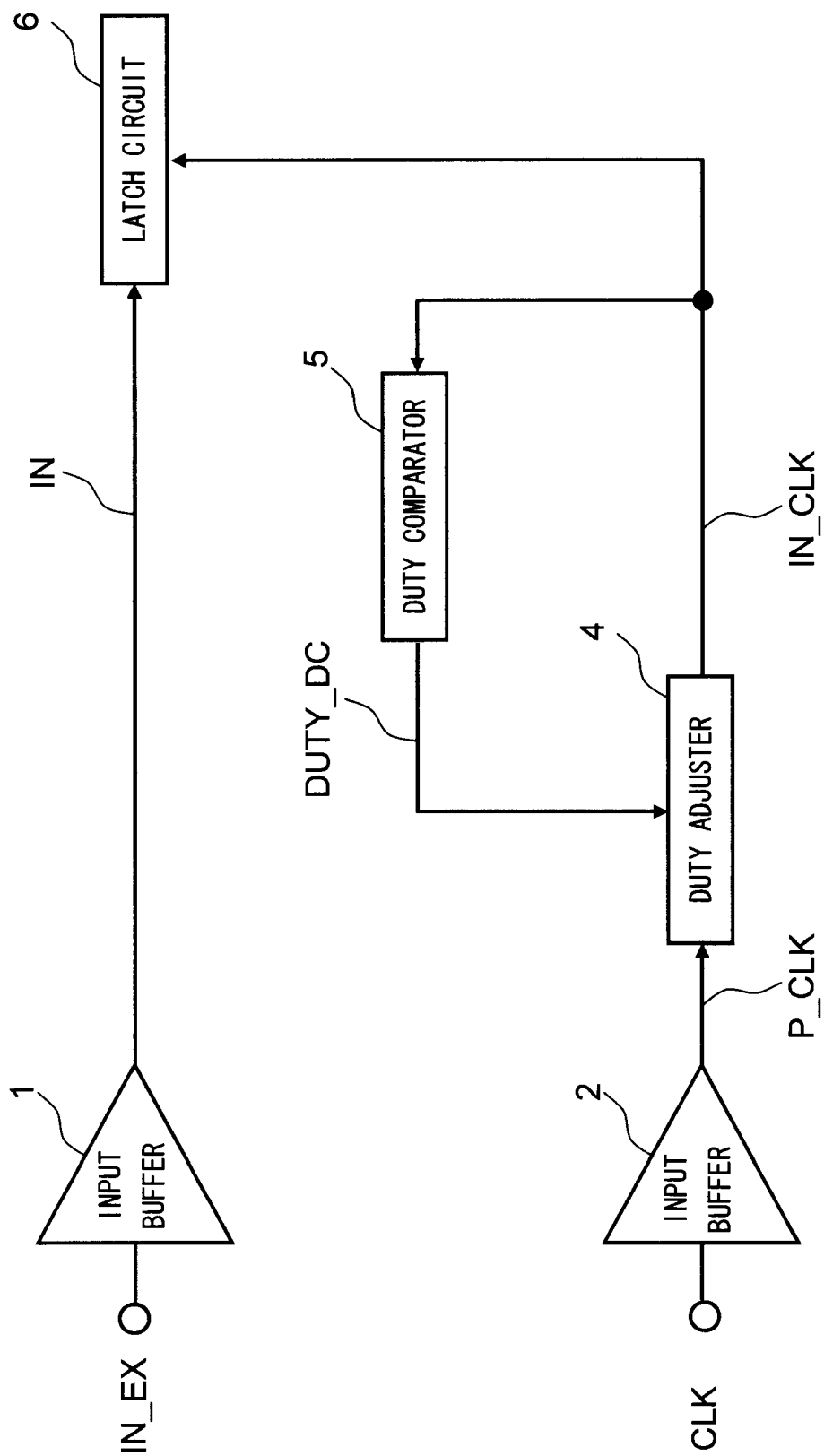
FIG. 8 is a block diagram of a duty ratio correction circuit to describe a concern of the present invention.
Figure 9A:
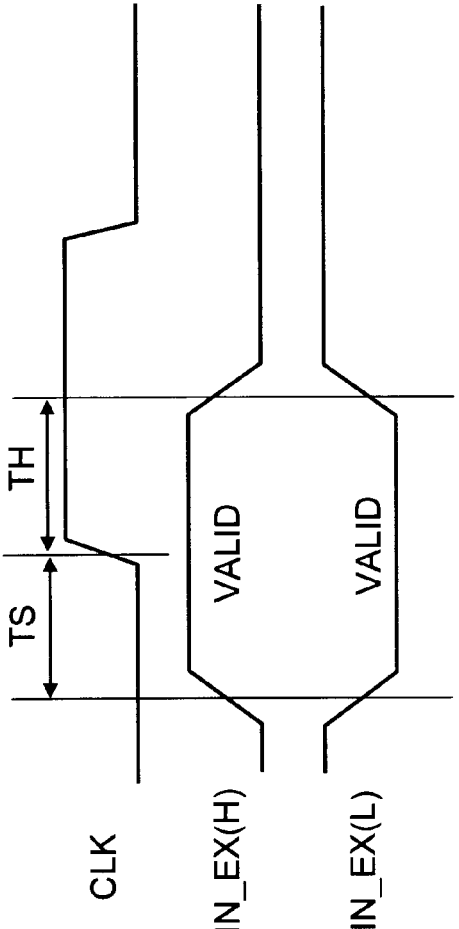
FIGS. 9A and 9B are waveform charts of an external data signal and an internal data signal, respectively.
Figure 9B:
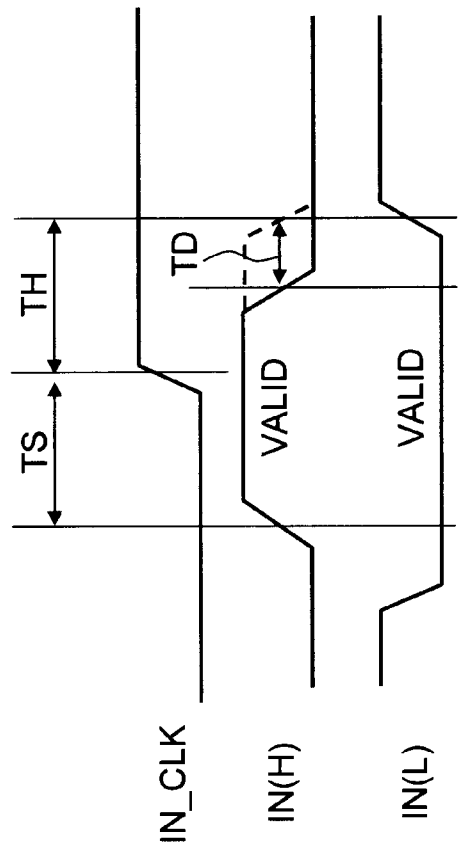
Figure 10:
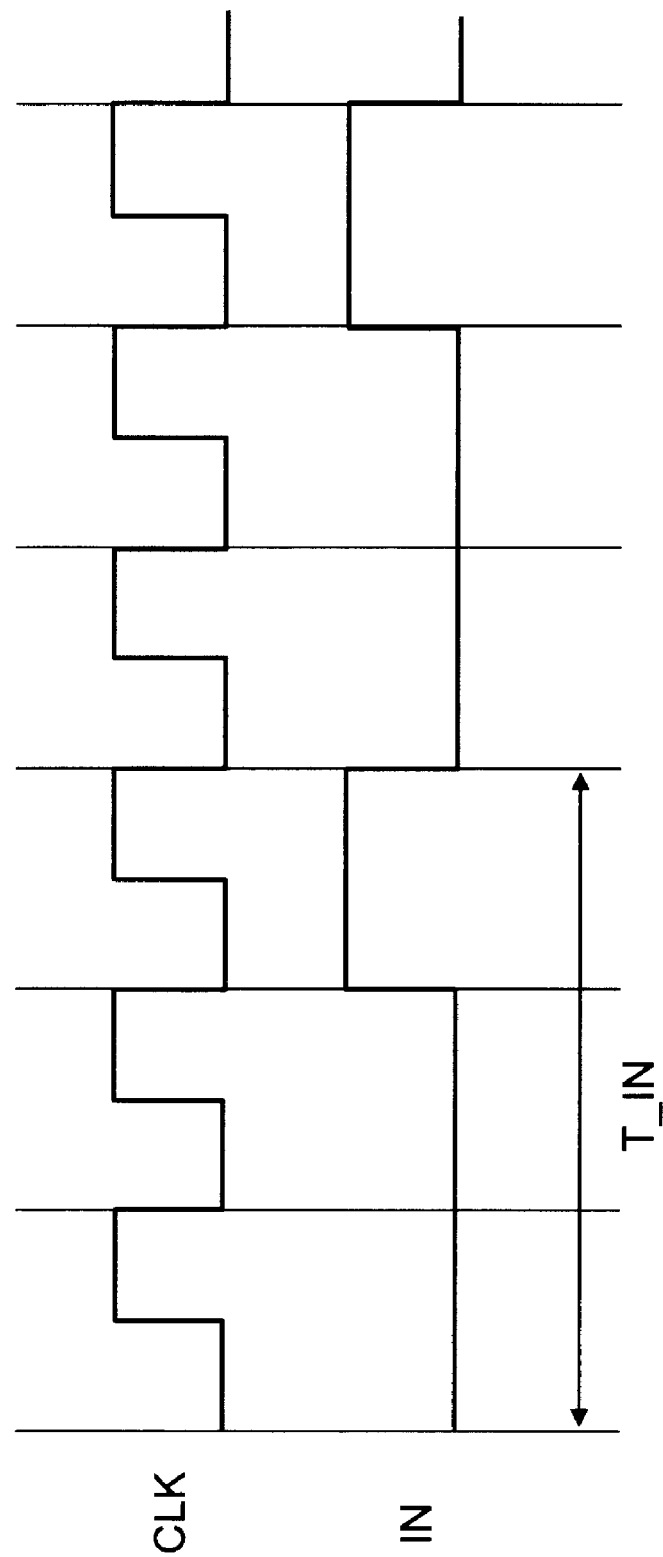
FIG. 10 is an example of an input waveform as an issue.

FIG. 7 is an example of the duty adjuster 204. In the duty adjuster 204, the drains of P-channel MOS transistor switches P8, P9, . . . , Pn are connected to the source of a P-channel MOS transistor P7. The sources of the P-channel MOS transistor switches P8, P9, . . . , Pn are connected to the power supply VDD. On the other hand, the drains of N-channel MOS transistor switches N8, N9, . . . , Nn are connected to the source of an N-channel MOS transistor N7. The sources of the N-channel MOS transistor switches N8, N9, . . . , Nn are grounded.

A control logic signal IDP8 is connected to the gate of the P-channel MOS transistor switch P8, a control logic signal IDP9 is connected to the gate of the P-channel MOS transistor switch P9, and a control logic signal IDPn is connected to the gate of the P-channel MOS transistor switch Pn. On the other hand, a control logic signal IDN8 is connected to the gate of the N-channel MOS transistor switch N8, a control logic signal IDN9 is connected to the gate of the N-channel MOS transistor switch N9, and a control logic signal IDNn is connected to the gate of the N-channel MOS transistor switch Nn. The value of "n" depends on the number of steps of duty adjustment.

A clock signal D_CLK which is output from a node at which the drain of the P-channel MOS transistor P7 and the drain of the N-channel MOS transistor N7 are connected to each other is input to an inverter 211. The inverter 211 then inverts and shapes the clock signal D_CLK and outputs it as the internal clock signal IN_CLK.

In the case of extending the "L" width of the internal clock signal IN_CLK with respect to the clock signal P_CLK, a selected number of signals from the control logic signals IDN8 to IDNn which corresponds to the amount of adjustment are set to "L". The N-channel MOS transistor switches N8 to Nn to which "L" is input are turned OFF. As a result, the current capacity of the N-channel MOS transistor N7 is reduced, and the "L" output of the clock signal D_CLK is delayed. In this case, because the current capacity of the P-channel MOS transistor P7 stays the same, the "H" output does not change. Consequently, the "L" width of the internal clock signal IN_CLK which is inverted and shaped by the inverter 211 can be extended.

On the contrary, in the case of extending the "H" width of the internal clock signal IN_CLK with respect to the clock signal P_CLK, a selected number of signals from the control logic signals IDP8 to IDPn which corresponds to the amount of adjustment are set to "H". The P-channel MOS transistor switches P8 to Pn to which "H" is input are turned OFF. As a result, the current capacity of the P-channel MOS transistor P7 is reduced, and the "H" output of the clock signal D_CLK is delayed. In this case, because the current capacity of the N-channel MOS transistor N7 stays the same, the "L" output does not change. Consequently, the "H" width of the internal clock signal IN_CLK which is inverted and shaped by the inverter 211 can be extended.

Figure 4:
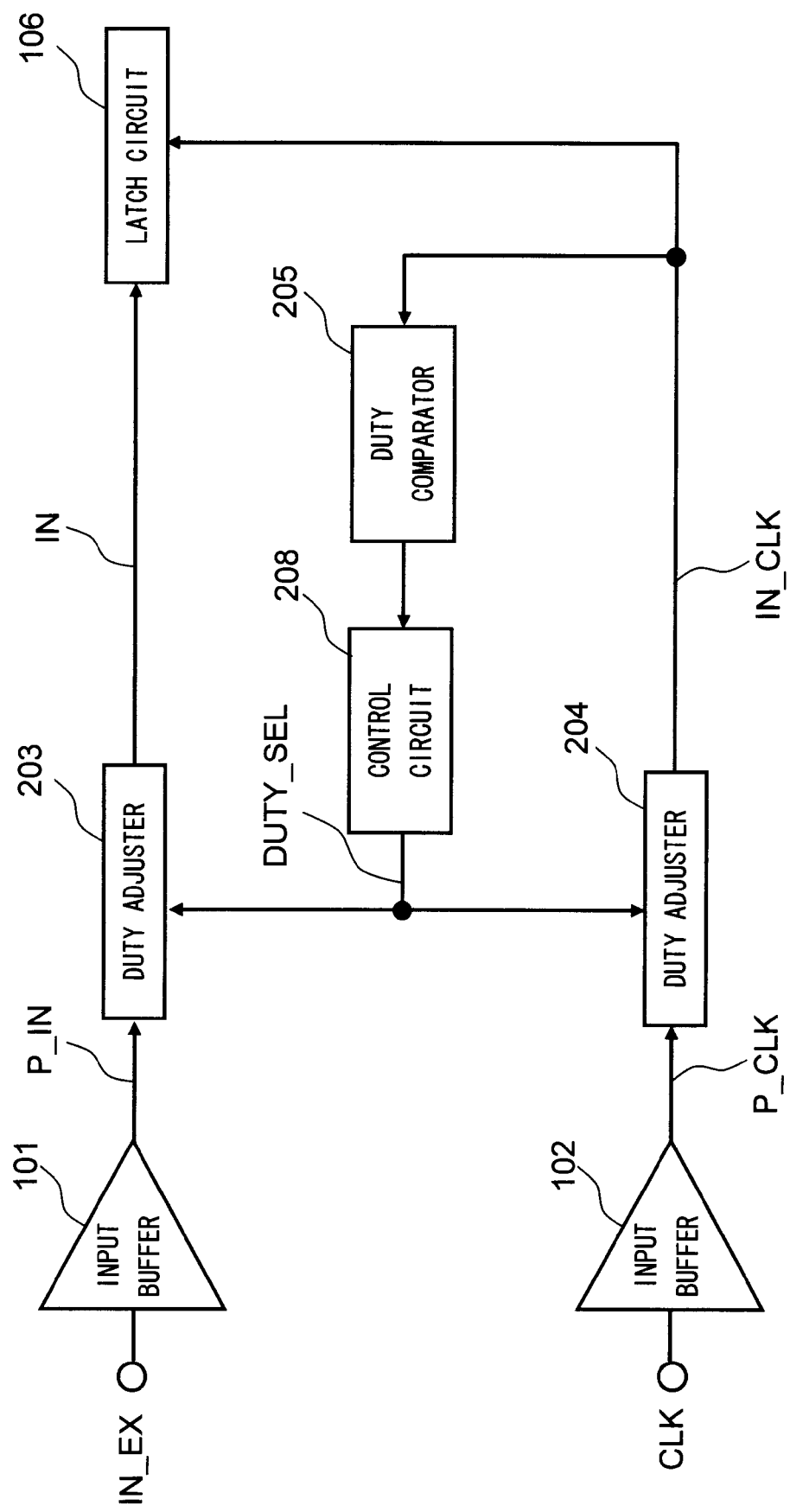
FIG. 4 is a block diagram of a duty ratio correction circuit according to a second exemplary embodiment of the present invention.

The control logic signals IDP8 to IDPn and IDN8 to IDNn form the control logic signal DUTY_SEL shown in FIG. 4. The control logic signal DUTY_SEL is determined by the duty comparator 205 and the control circuit 208 as described above. The duty ratio of the clock can be thereby automatically corrected. By using the control logic signal DUTY_SEL as a correction value of the asynchronous external data signal IN_EX, the duty ratio of the external data signal IN_EX can be also corrected.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A duty ratio correction circuit comprising:
a clock input buffer that receives a first clock signal;
a clock duty adjuster that adjusts a duty ratio of a second clock signal output from the clock input buffer based on a correction signal and generates a third clock signal;
a data input buffer that receives a first data signal;
a data duty adjuster that adjusts a duty ratio of a second data signal output from the data input buffer based on the correction signal and generates a third data signal; and
a duty comparator that generates the correction signal based on a signal in phase with the third clock signal and a signal in opposite phase to the third clock signal,
wherein the first data signal is an asynchronous signal.

2. The duty ratio correction circuit according to claim 1, wherein the clock duty adjuster and the data duty adjuster comprise:
an inverter that includes a first P-channel transistor and a first N-channel transistor;
a plurality of P-channel transistors that are connected in parallel between a source of the first P-channel transistor and a high-potential power supply; and
a plurality of N-channel transistors that are connected in parallel between a source of the first N-channel transistor and a low-potential power supply.

3. The duty ratio correction circuit according to claim 1, wherein a circuit configuration of the clock input buffer and a circuit configuration of the data input buffer are identical.

4. The duty ratio correction circuit according to claim 1, wherein a circuit configuration of the clock duty adjuster and a circuit configuration of the data duty adjuster are identical.

5. The duty ratio correction circuit according to claim 1, further comprising:
a latch circuit that receives the third clock signal and the third data signal.

6. The duty ratio correction circuit according to claim 1, wherein the duty comparator comprises a differential amplifier that receives the signal in phase with the third clock signal and the signal in opposite phase to the third clock signal.

7. The duty ratio correction circuit according to claim 1, wherein the clock duty adjuster and the data duty adjuster comprise a plurality of clocked inverters that are connected in series.

8. A duty ratio correction method comprising:
generating a second clock signal from an input first clock signal through a clock input buffer;
generating a second data signal from an input first data signal through a data input buffer;
generating a third clock signal by adjusting a duty ratio of the second clock signal based on a correction signal;
generating a third data signal by adjusting a duty ratio of the second data signal based on the correction signal; and
generating the correction signal based on a signal in phase with the third clock signal and a signal in opposite phase to the third clock signal,
wherein the first data signal is an asynchronous signal.

9. A semiconductor device comprising:
a clock duty adjuster configured to adjust a duty ratio of a first clock signal based on a correction signal and to generate a second clock signal;
a duty comparator configured to generate the correction signal based on a first internal signal in phase with the second clock signal and a second internal signal in opposite phase to the second clock signal; and
a data duty adjuster configured to adjust a duty ratio of a first data signal based on the correction signal and to generate a second data signal, wherein the first data signal is an asynchronous signal.

10. The semiconductor device according to claim 9, further comprising:
a first input buffer coupled to an input of the clock duty adjuster; and
a second input buffer coupled to an input of the data duty adjuster,
wherein a circuit configuration of the first input buffer and a circuit configuration of the second input buffer are identical.

11. The semiconductor device according to claim 10, wherein a circuit configuration of the clock duty adjuster and a circuit configuration of the data duty adjuster are identical.

12. The semiconductor device according to claim 9, further comprising a latch circuit receives the second clock signal and the second data signal.

13. The semiconductor device according to claim 9, wherein the first internal signal and the second internal signal are generated based on the second clock signal.

* * * * *